United States Patent
Wu et al.

(10) Patent No.: US 11,282,779 B2
(45) Date of Patent: *Mar. 22, 2022

(54) PACKAGE STRUCTURE AND FABRICATING METHOD THEREOF

(71) Applicant: Taiwan Semiconductor Manufacturing Co., Ltd., Hsinchu (TW)

(72) Inventors: Kai-Chiang Wu, Hsinchu (TW); Jiun-Yi Wu, Taoyuan (TW); Yu-Min Liang, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 35 days.

This patent is subject to a terminal disclaimer.

(21) Appl. No.: 16/796,905

(22) Filed: Feb. 20, 2020

(65) Prior Publication Data
US 2021/0098354 A1 Apr. 1, 2021

Related U.S. Application Data

(60) Provisional application No. 62/906,728, filed on Sep. 27, 2019.

(51) Int. Cl.
*H01L 23/498* (2006.01)
*H01L 23/00* (2006.01)

(52) U.S. Cl.
CPC .. *H01L 23/49833* (2013.01); *H01L 23/49816* (2013.01); *H01L 23/49822* (2013.01); *H01L 23/562* (2013.01)

(58) Field of Classification Search
CPC ............. H01L 23/49833; H01L 23/562; H01L 23/49816; H01L 23/49822
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,867,947 B2 * | 12/2020 | Wu ..................... | H01L 23/3128 |

(Continued)

*Primary Examiner* — Nicholas J Tobergte
(74) *Attorney, Agent, or Firm* — JCIPRNET

(57) ABSTRACT

A package structure including a first circuit board structure, a redistribution layer structure, bonding elements, and a semiconductor package is provided. The redistribution layer structure is disposed over and electrically connected to the first circuit board structure. The bonding elements are disposed between and electrically connected to the redistribution layer structure and the first circuit board structure. Each of the bonding elements has a core portion and a shell portion surrounding the core portion. A stiffness of the core portion is higher than a stiffness of the shell portion. A semiconductor package is disposed over and electrically connected to the redistribution layer structure.

20 Claims, 17 Drawing Sheets

(56) References Cited

U.S. PATENT DOCUMENTS

2010/0193959 A1* 8/2010 Grygiel .............. H01L 23/5286
  257/773
2018/0040569 A1* 2/2018 Lee ................... H01L 23/49838
2019/0393121 A1* 12/2019 Swaminathan ......... H01L 24/09

* cited by examiner

PACKAGE STRUCTURE AND FABRICATING METHOD THEREOF

CROSS-REFERENCE TO RELATED APPLICATION

This application claims the priority benefit of U.S. provisional application Ser. No. 62/906,728, filed on Sep. 27, 2019. The entirety of the above-mentioned patent application is hereby incorporated by reference herein and made a part of this specification.

BACKGROUND

Package structures are used in a variety of electronic applications, such as personal computers, cell phones, digital cameras, and other electronic equipment. In a conventional package structure, a semiconductor die may be bonded to other devices external to the semiconductor die through solder balls. After the solder balls have been placed, a reflow operation may be performed so as to obtain better connection between the semiconductor die and other devices external to the semiconductor die.

Recently, high-performance computing (HPC) has become more popular and being widely used in advanced networking and server applications, especially for AI (artificial intelligence) related products that require high data rate, increasing bandwidth and for lowering latency. However, as the package size is getting larger for packages including the HPC component, more challenging in the connection between different components occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
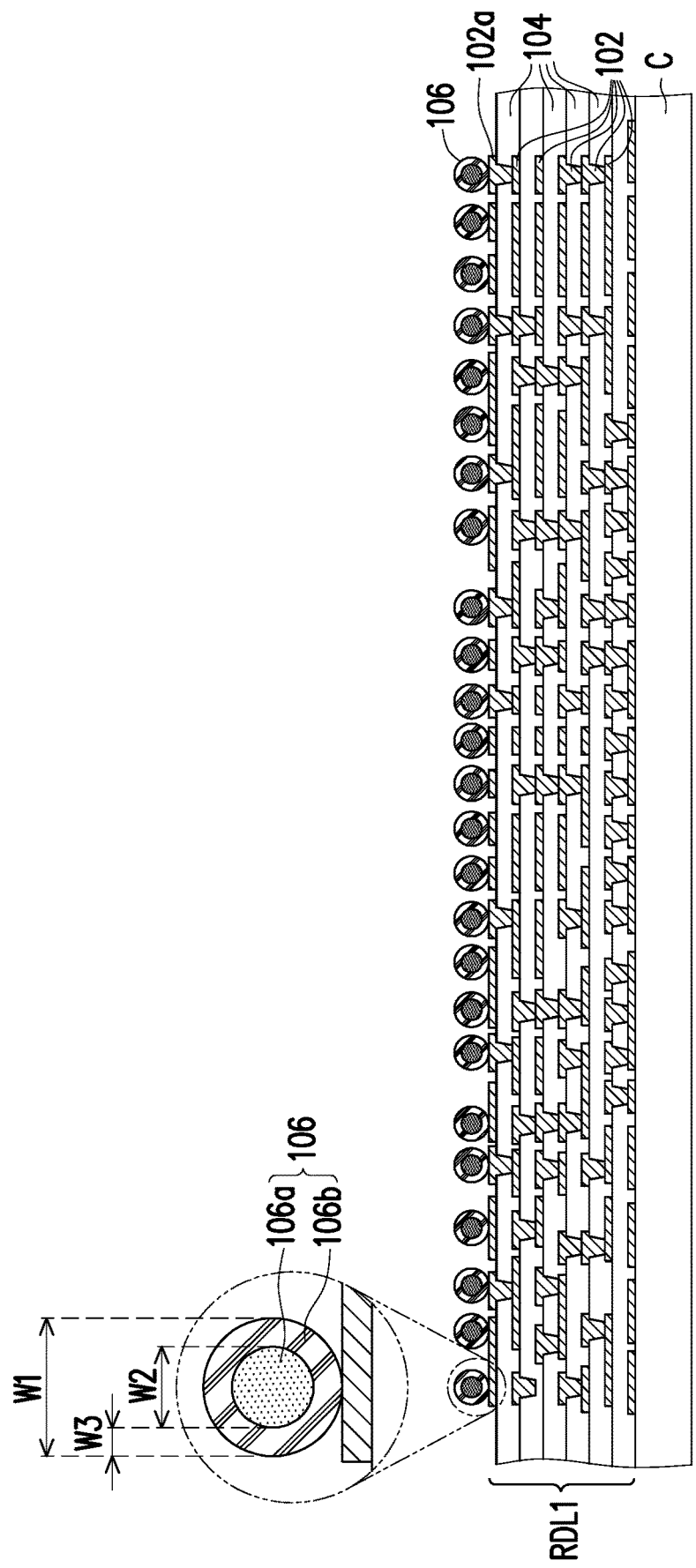
FIGS. 1A through 1I schematically illustrate cross-sectional views for manufacturing a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3D-IC devices. The testing structures may include, for example, test pads formed in a redistribution layer structure or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic sectional views of various stages in a method of manufacturing a semiconductor package according to some exemplary embodiments of the present disclosure.

Referring to FIG. 1A, a redistribution layer structure RDL1 is formed over a carrier C. In some embodiments, the carrier C may be a glass carrier or any suitable carrier for depositing the redistribution layer structure RDL1.

In some embodiments, the redistribution layer structure RDL1 may be a fan-out redistribution layer structure, for example. The redistribution layer structure RDL1 includes a plurality of dielectric layers and a plurality of conductive patterns stacked alternately. In some embodiments, the formation of the redistribution layer structure RDL1 may include sequentially forming a plurality of conductive patterns 102, 102a and a plurality of dielectric layers 104, wherein the conductive patterns 102, 102a and the dielectric layers 104 are alternately stacked over the carrier C. In some embodiments, the redistribution layer structure RDL1 includes a plurality of vias in the dielectric layers 104. The conductive patterns 102, 102a may be connected with each other through the vias in the dielectric layers 104. In some embodiments, the outermost conductive pattern 102a (also referred to as the exposed conductive pattern 102a or the topmost conductive pattern 102a) is used as bonding pads, wherein the outermost or uppermost conductive pattern 102a is located at a side of the redistribution layer structure RDL1 opposite to the carrier C.

In some embodiments, the conductive patterns 102, 102a may be formed by a deposition followed by a photolithography and etching process. In some embodiments, the conductive patterns 102, 102a may be formed by an electroplating or an electroless plating. In some embodiments, the conductive patterns 102, 102a include metal, such as aluminum, titanium, copper, nickel, tungsten, and/or alloys thereof. In some embodiments, the dielectric layers 104 are formed by suitable fabrication techniques such as spin-on coating, chemical vapor deposition (CVD), plasma-enhanced chemical vapor deposition (PECVD) or the like. In some embodiments, a thickness of the dielectric layer 104 is in a range of about 5 μm to about 50 μm. In some embodiments, a material of the dielectric layers 104 is polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a molding compound, a substrate-based material (such as solder mask, or bismaleimide-triazine (BT), polypropylene (PP)), a combination thereof or the like.

After forming the redistribution layer structure RDL1, a plurality of bonding elements 106 are deposited on the redistribution layer structure RDL1. In some embodiments, each of the bonding elements 106 has a core portion 106a and a shield portion 106b surrounding the core portion 106a. In other words, each of the bonding elements 106 has a core-shell structure. In some embodiments, the core portion 106a may be ball-shaped and the shell portion 106b is coated on the surface of the core portion 106a. In some embodiments, a diameter W1 of the bonding elements 106 is in a range of about 100 um to about 400 um. In some embodiments, a diameter W2 of the core portion 106a is in a range of about 50 um to about 100 um, and a thickness W3 of the shell portion 106b is in a range of about 50 um to about 350 um. In some embodiments, a method of depositing the bonding elements 106 includes a ball placement process, and the bonding elements 106 may be a ball grid array (BGA) connectors. In some embodiments, the pitch of the bonding elements 106 may be 200 μm to 600 μm.

A material of the core portion 106a is different to a material of the shell portion 106b. In some embodiments, a material of the core portion 106a includes metal (e.g. copper, other suitable metal and/or alloys thereof) or plastic (e.g. polymethyl methacrylate, polycarbonate or other suitable plastic). In some embodiments, a material of the shell portion 106b includes conductive material, such as solder material (e.g. tin, tin/silver/copper (SAC) solder, or other suitable material). A stiffness of the core portion 106a is higher than a stiffness of the shell portion 106b, such that a mechanical strength of the bonding elements 106 can be improved.

Figure 1B:
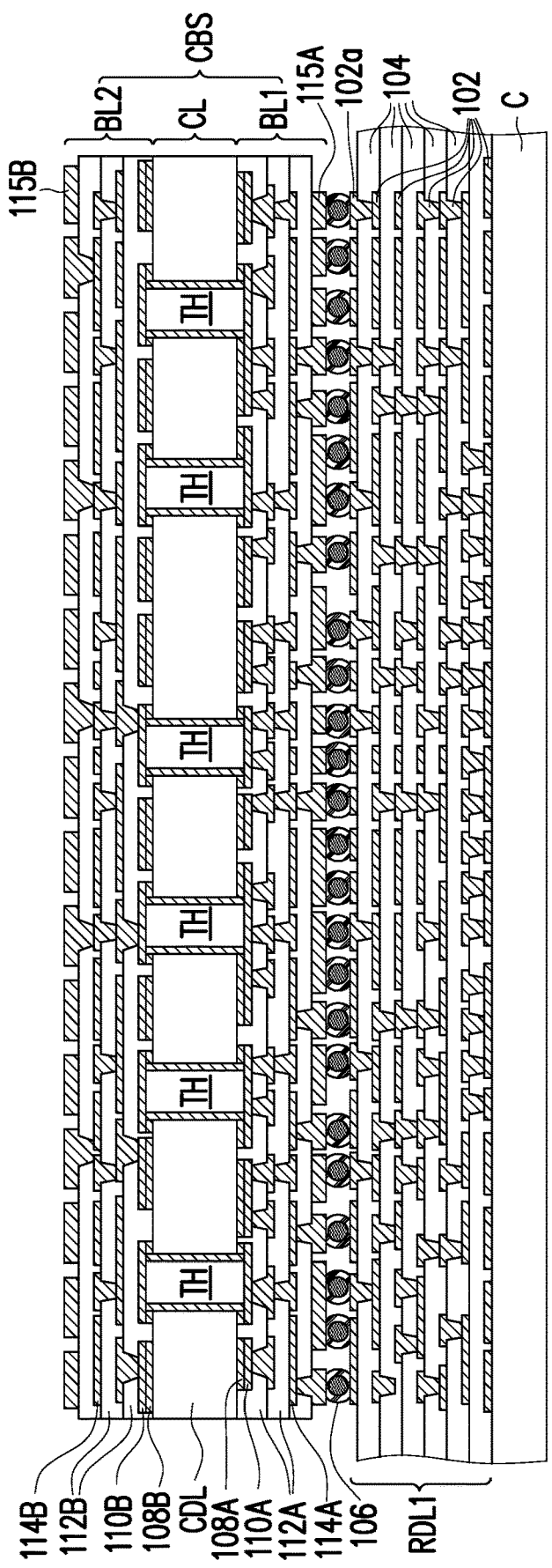

Referring to FIG. 1B, a circuit board structure CBS is bonded to the redistribution layer structure RDL1 through the bonding elements 106. In some embodiments, more than one of the circuit board structure CBS is bonded to the redistribution layer structure RDL1. In the present embodiment, the bonding elements 106 are deposited on the redistribution layer structure RDL1 before bonding the circuit board structure CBS to the redistribution layer structure RDL1. However, the disclosure is not limited thereto. In other embodiments, the bonding elements 106 are deposited on the circuit board structure CBS before bonding the circuit board structure CBS to the redistribution layer structure RDL1 so as to improve the yield of the bonding process. In other embodiment, a reflow process is performed after depositing the bonding elements 106 on the circuit board structure CBS so as to attach the bonding elements 106 onto the circuit board structure CBS.

In some embodiments, the circuit board structure CBS includes a core layer CL, a first build-up layer BL1, and a second build-up layer BL2. The first build-up layer BL1 and the second build-up layer BL2 are respectively located on opposite sides of the core layer CL. In some embodiments, the core layer CL includes a core dielectric layer CDL, core conductive layers 108A and 108B, conductive lids 110A and 110B, and plated through holes TH.

In some embodiments, a material of the core dielectric layer CDL includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or other dielectric materials. A method of forming the core dielectric layer CDL may include a lamination process, a coating process, or the like. The core conductive layers 108A and 108B are formed on the opposite sides of the core dielectric layer CDL and electrically connected with each other through the plated through holes TH, wherein the plated through holes TH are disposed in and penetrate through the core dielectric layer CDL. In some embodiments, the plated through holes TH may include a conductive material coated on sidewalls of through holes penetrating through the core dielectric layer CDL. The conductive lids 110A and 110B are located respectively over the core conductive layers 108A and 108B. In some embodiments, the conductive lids 110A and 110B include copper or other suitable conductive material, for example.

In some embodiments, the method of forming the plated through holes TH may include the following steps. First, through holes are formed in the core dielectric layer CDL by, for example, a mechanical or laser drilling, an etching, or another suitable removal technique. In some embodiments, a desmear treatment may be performed to remove residues remaining in the through holes. Subsequently, the through holes may be plated with one or more conductive materials, thereby the plated through holes TH are formed. For example, the through holes may be plated with copper by an electroplating or an electroless plating. In some embodiments, after plating the through holes, an insulating material is formed in the through holes so as to fill the through holes.

In some embodiments, the core layer CL may be formed by the following steps. First, first conductive materials (not shown) are respectively formed on two opposite surfaces of the core dielectric layer CDL. Then, the plated through holes TH penetrating through the core dielectric layer CDL are formed by the method as mentioned before, wherein the plated through holes TH provide electrical connection between the first conductive materials respectively formed on both surfaces of the core dielectric layer CDL. Thereafter, second conductive materials are respectively formed over the first conductive materials on the opposite surfaces of the core dielectric layer CDL, where the second conductive materials may be different from the first conductive materials. In some embodiments, the first and second conductive materials may be formed by using any suitable method (e.g., chemical vapor deposition (CVD), sputtering, printing, plating, or the like). Then, a photolithography and etching process or other suitable process is performed so as to pattern the first conductive materials and the second conductive materials together to form the core conductive layers 108A and 108B and the conductive lids 110A and 110B respectively.

The first and second build-up layers BL1 and BL2 are respectively disposed on the opposite sides of the core layer CL. Specifically, the first build-up layer BL1 is formed over the core conductive layer 108A of the core layer CL, and the second build-up layer BL2 is formed over the core conductive layer 108B of the core layer CL.

In some embodiments, the first build-up layer BL1 includes a plurality of first dielectric layers 112A and a plurality of first conductive patterns 114A, 115A, wherein the first dielectric layers 112A and the first conductive patterns 114A, 115A are alternately stacked over the first surface of the core layer CL. Similarly, the second build-up layer BL2 includes a plurality of second dielectric layers 112B and a plurality of second conductive patterns 114B, 115B, wherein the second dielectric layers 112B and the second conductive patterns 114B, 115B are alternately stacked over the second surface of the core layer CL. In some embodiments, a material of the dielectric layers 112A, 112B may be ABF, prepreg, RCC, polyimide, PID, molding compound, a combination thereof, or the like. In some alternative embodiments, the core dielectric layer CDL and the first and second dielectric layers 112A, 112B may be made of the same material. For example, the material of the core dielectric layer CDL and the first and second dielectric layers 112A, 112B may be molding compound such as epoxy molding compound (EMC). The dielectric layers 112A, 112B may be formed by a lamination process, a coating process, or the like. Although only three layers of the conductive patterns and three layers of the dielectric layers are illustrated for each of the first build-up layer BL1 and the second build-up layer BL2, the scope of the disclosure is not limited thereto. In other embodiments, the number of dielectric layers (112A/112B) and the number of the conductive patterns (114A/114B/115A/115B) may be adjusted upon the design requirements.

In some embodiments, a thickness of the core layer CL is in a range of 200 μm to 1600 μm, for example. In some embodiments, a thickness of the dielectric layer 112A, 112B is in a range of 10 μm to 100 μm, and a thickness of the conductive pattern 114A, 114B, 115A, 115B is in a range of 10 μm to 50 μm, for example. In some embodiments, a thickness of the outermost conductive patterns 115A, 115B may be larger than a thickness of inner conductive patterns 114A, 114B, for example. In some alternative embodiments, the first build-up layer BL1 may be omitted, and the core layer CL may be bonded to the redistribution layer structure RDL1 through the bonding elements 106. In some embodiments, the total number of layers of the first build-up layer BL1 may sum up to a total of 0 to 8 layers for the conductive patterns and dielectric layers, and the total number of layers of the second build-up layer BL2 may sum up to a total of 0 to 8 layers for the conductive patterns and dielectric layers. In some embodiments, the total number of layers of the first build-up layer BL1 and the second build-up layer BL2 in the circuit board structure CBS is less than the total number of layers of the build-up layer in the conventional circuit board structure, which may be 28 to 36 layers. Therefore, the circuit board structure CBS may be also called a semi-finished circuit substrate or a semi-finished circuit carrier in some examples.

The outermost conductive patterns 115A of the first build-up layer BL1 are bonded to the bonding elements 106, so that the circuit board structure CBS and the redistribution layer structure RDL1 are electrically connected with each other.

In some embodiments, a reflow process is performed on the bonding elements 106 so as to attach the circuit board structure CBS onto the redistribution layer structure RDL1 through the bonding elements 106 and shape the bonding elements 106 into the desired shapes. In some embodiments, the shell portion 106b may deform after the reflow process without a deformation of the core portion 106a. In some embodiments, both of the shell portion 106b and the core portion 106a may deform after the reflow process. In some embodiments, the bonding elements 106 may be ball-shaped before the reflow process. In some embodiments, the bonding elements 106 may be pillar-shaped after the reflow process. However, the disclosure is not limited thereto. The temperature of the reflow process performed on the bonding elements 106 is in a range of about 120 degrees centigrade to about 300 degrees centigrade.

Figure 1C:
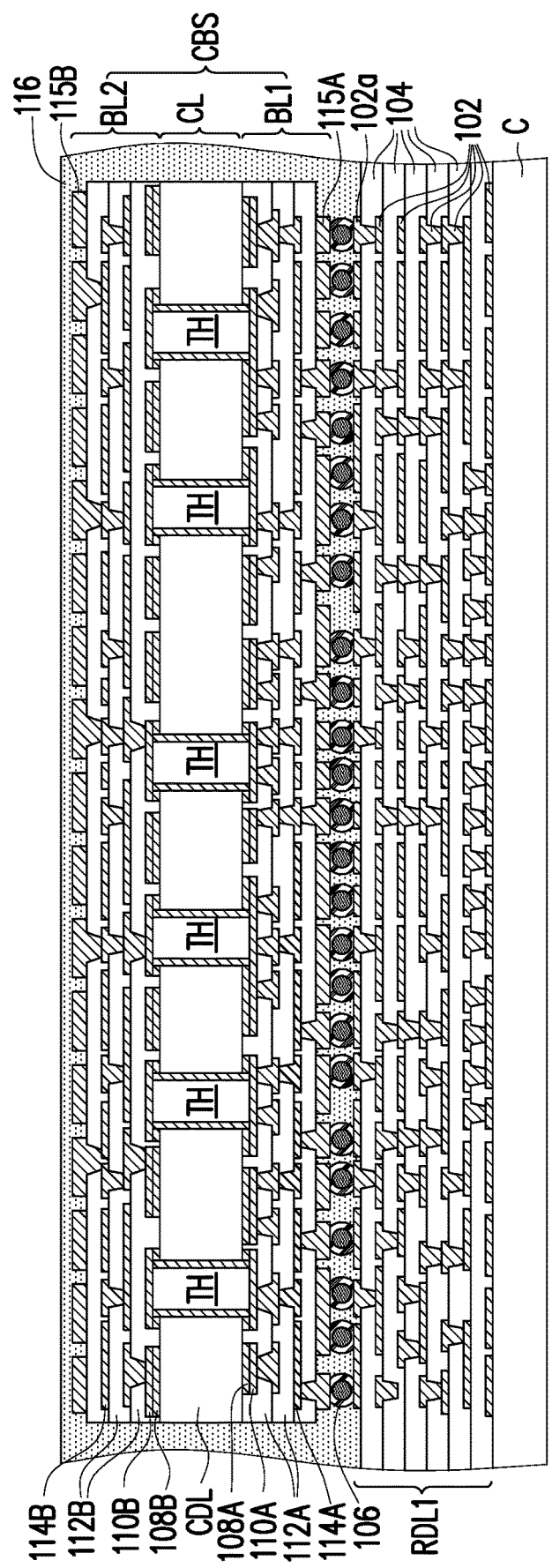

Referring to FIG. 1C, after the circuit board structure CBS and the redistribution layer structure RDL1 are bonded, an insulating material 116 is formed over the carrier C so as to encapsulate the circuit board structure CBS on the redistribution layer structure RDL1. In some embodiments, the insulating material 116 may be molding compound, molded underfill, polymer such as polyimide, polybenzoxazole (PBO) or benzocyclobutene (BCB), Ajinomoto Buildup Film (ABF) or other suitable encapsulating materials, for example. In some embodiments, the insulating material 116 may be formed by a molding process or other suitable methods. In the exemplary embodiment, the insulating material 116 is formed by an over-molding process. In some embodiments, the insulating material 116 covers the outermost conductive patterns 115B of the second build-up layer BL2 and a sidewall of the circuit board structure CBS. In addition, the insulating material 116 is formed between the outermost conductive patterns 115A of the first build-up layer BL1 and formed between the bonding elements 106. In other words, the circuit board structure CBS is embedded in the insulating material 116.

In some embodiments, as mentioned before, the insulating material 116 may be formed by an over-molding process. However, the disclosure is not limited thereto. In other embodiments, the insulating material 116 may be formed by a mold with a release film pressed against the top surfaces of the outermost conductive patterns 115B, and the conductive patterns 115B may be exposed after removing the mold and the release film.

Figure 1D:
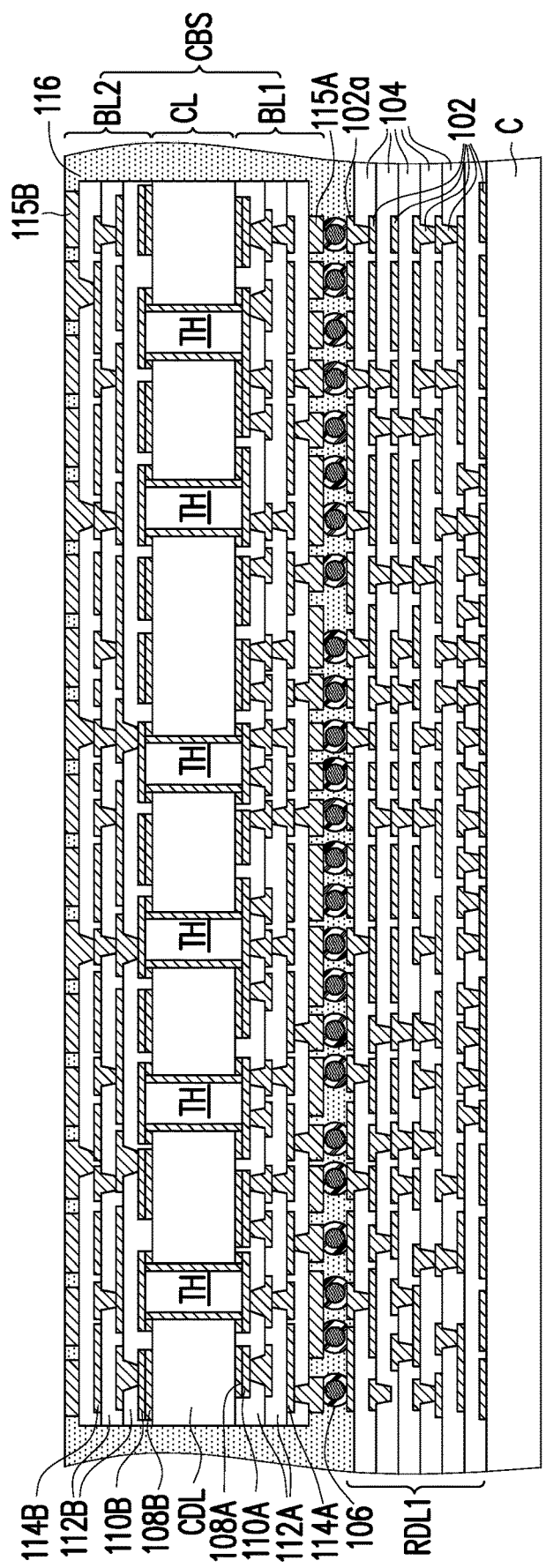

Referring to FIG. 1D, a portion of the insulating material 116 is removed, so as to expose the outermost conductive patterns 115B of the second build-up layer BL2. In other words, after removing the portion of the insulating material 116, a side of the circuit board structure CBS opposite to the redistribution layer structure RDL1 is exposed by the insulating material 116. In some embodiments, the insulating material 116 may be partially removed by a grinding process or a planarization process such as a chemical mechanical polishing process until the outermost conductive patterns 115B are exposed. In some embodiments, after grinding, a top surface of the remaining insulating material 116 is substantially flush with a top surface of the circuit board structure CBS. That is, the top surfaces of the insulating material 116 are substantially coplanar with the top surfaces of the outermost conductive patterns 115B.

In the present embodiment, since the bonding elements 106 include the core portions 106a and the shell portions 106b, the bonding elements 106 may not be deformed by pressure when grinding the insulating material 116. Therefore, the gap between the circuit board structure CBS and the redistribution layer structure RDL1 can be controlled and the yield of the grinding process may be improved.

Figure 1E:
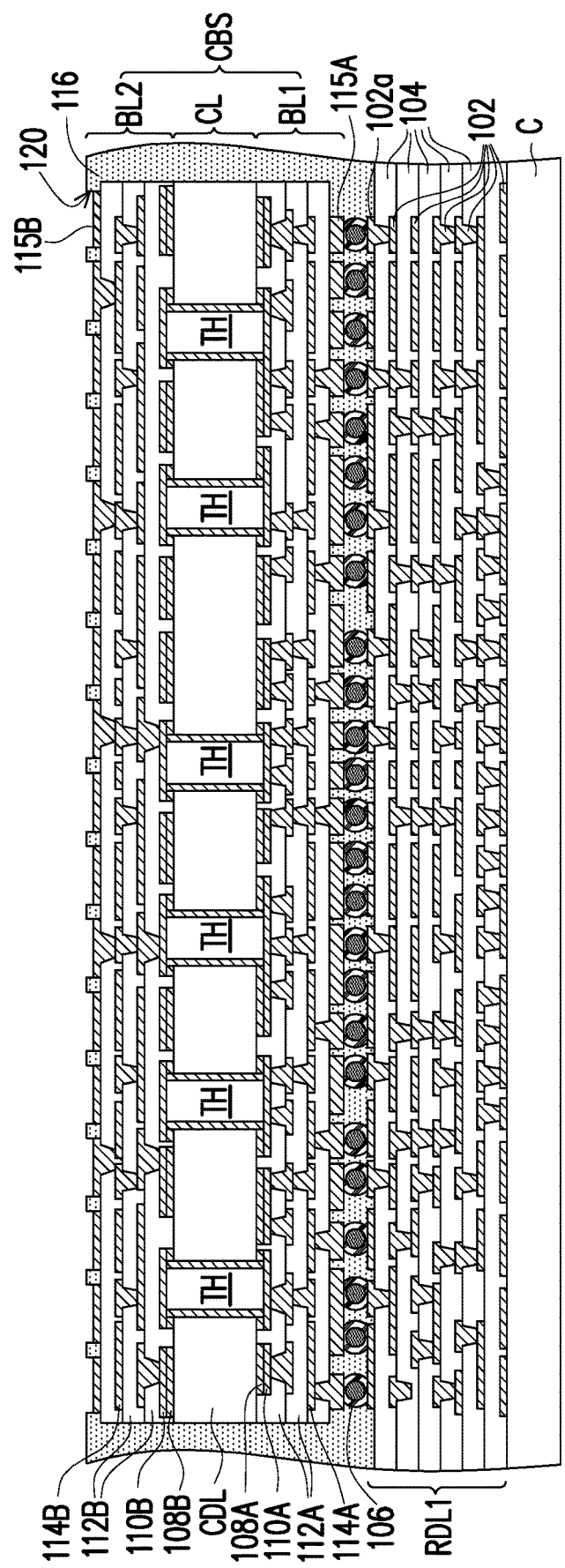

Referring to FIG. 1E, portions of the outermost conductive patterns 115B are removed, and the top surfaces of the outermost conductive patterns 115B are lower than the top surfaces of the insulating material 116. In some embodiments, the outermost conductive patterns 115B may be partially removed by an etching process such as a soft etching process. In addition, after the etching process, a surface treatment such as an organic solderability preservative (OSP) surface treatment may be performed on the top surfaces of the outermost conductive patterns 115B, for example. In some embodiments, after being partially removed, a thickness of the outermost conductive pattern 115B may be in a range of 10 μm to 50 μm, for example. In some embodiments, as shown in FIG. 1E, an opening 120 is formed at a top surface of the insulating material 116, and the opening 120 exposes the outermost conductive pattern 115B. In some examples, the opening 120 may be also called a housing space or a recess for conductive terminal. In some embodiments, the opening 120 may have a depth (i.e., a height difference between the outermost conductive pattern 115B and the grinded surface of the insulating material 116) in a range of 0 to 60 μm, and a width in a range of 300 μm to 700 μm, for example.

Figure 1F:
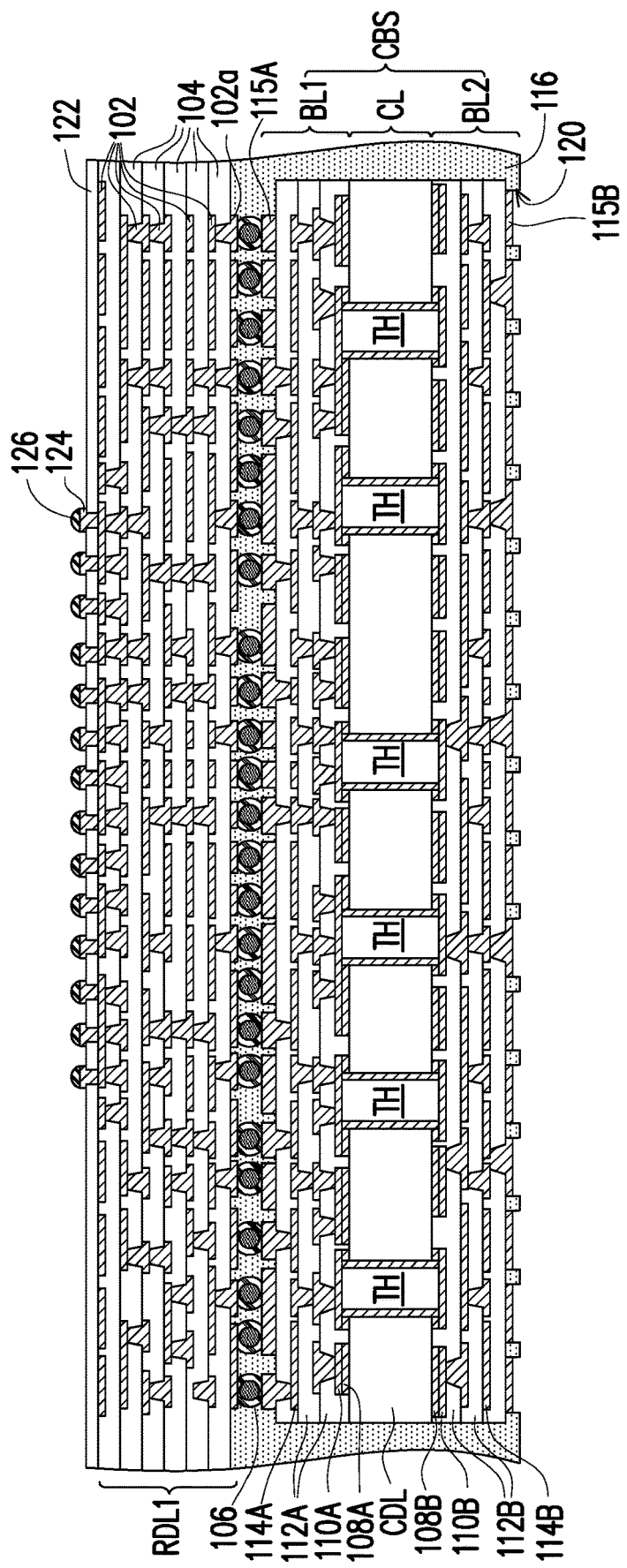

Referring to FIG. 1F, the redistribution layer structure RDL1 with the circuit board structure CBS thereover is de-bonded from the carrier C and is turned upside down. That is, the carrier C is removed. A dielectric layer 122 and a conductive pattern 124 are formed on the redistribution layer structure RDL1, wherein the conductive pattern 124 is electrically connected with the redistribution layer structure RDL1. In some embodiments, the dielectric layer 122 is formed on a side of the redistribution layer structure RDL1 opposite to the bonding elements 106. In some embodiments, a material of the dielectric layer 122 may be polymer such as polyimide, polybenzoxazole (PBO) or benzocyclobutene (BCB), nitride such as silicon nitride, oxide such as silicon oxide, phosphosilicate glass (PSG), borosilicate glass (BSG), boron-doped phosphosilicate glass (BPSG), a combination thereof or the like. In some embodiments, the dielectric layer 122 may be formed by suitable fabrication techniques such as spin-on coating, chemical vapor deposition (CVD), plasma-enhanced chemical vapor deposition (PECVD) or the like. In some embodiments, the material of the dielectric layer 122 may be different from the material of the dielectric layer 104 of the redistribution layer structure RDL1, for example. In the exemplary embodiment, the dielectric layer 104 may be made of molding compound, and the dielectric layer 122 may be made of polymer such as polyimide. However, the disclosure is not limited thereto. In some embodiments, the conductive pattern 124 is used as conductive terminals, which may include a plurality of conductive pillars and a plurality of under-ball metallurgy (UBM) patterns therebeneath for ball mount. In some embodiments, the redistribution layer structure RDL1 and the dielectric layer 122 and the conductive pattern 124 over the redistribution layer structure RDL1 may be collectively referred to as a redistribution layer structure over the circuit board structure CBS.

After forming the conductive pattern 124 in the dielectric layer 122, the bonding structures 126 are formed on and electrically connected to the redistribution layer structure RDL1 through the conductive pattern 124. In some embodiments, the bonding structures 126 may be solder regions such as micro-bumps or the like. In some embodiments, a material of the bonding structures 126 is the same as the material of the shell portion 106b of the bonding elements 106. In other word, a stiffness of the core portion 106a is higher than a stiffness of the bonding structures 126.

In some embodiments, the bonding structures 126 may be formed by a mounting process and a reflow process, for example. In some embodiments, a diameter of the bonding structures 126 is, for example, in a range of about 10 μm to about 100 μm, and the diameter of the bonding structures 126 is smaller than the diameter of the bonding elements 106. In some embodiments, a pitch of the bonding structures 126 may be 20 μm to 200 μm, and the pitch of the bonding structures 126 is smaller than the pitch of the bonding elements 106. During the formation of the conductive pattern 124 and the bonding structures 126, the outermost conductive patterns 115B of the circuit board structure CBS may be protected from being damaged.

Figure 1G:
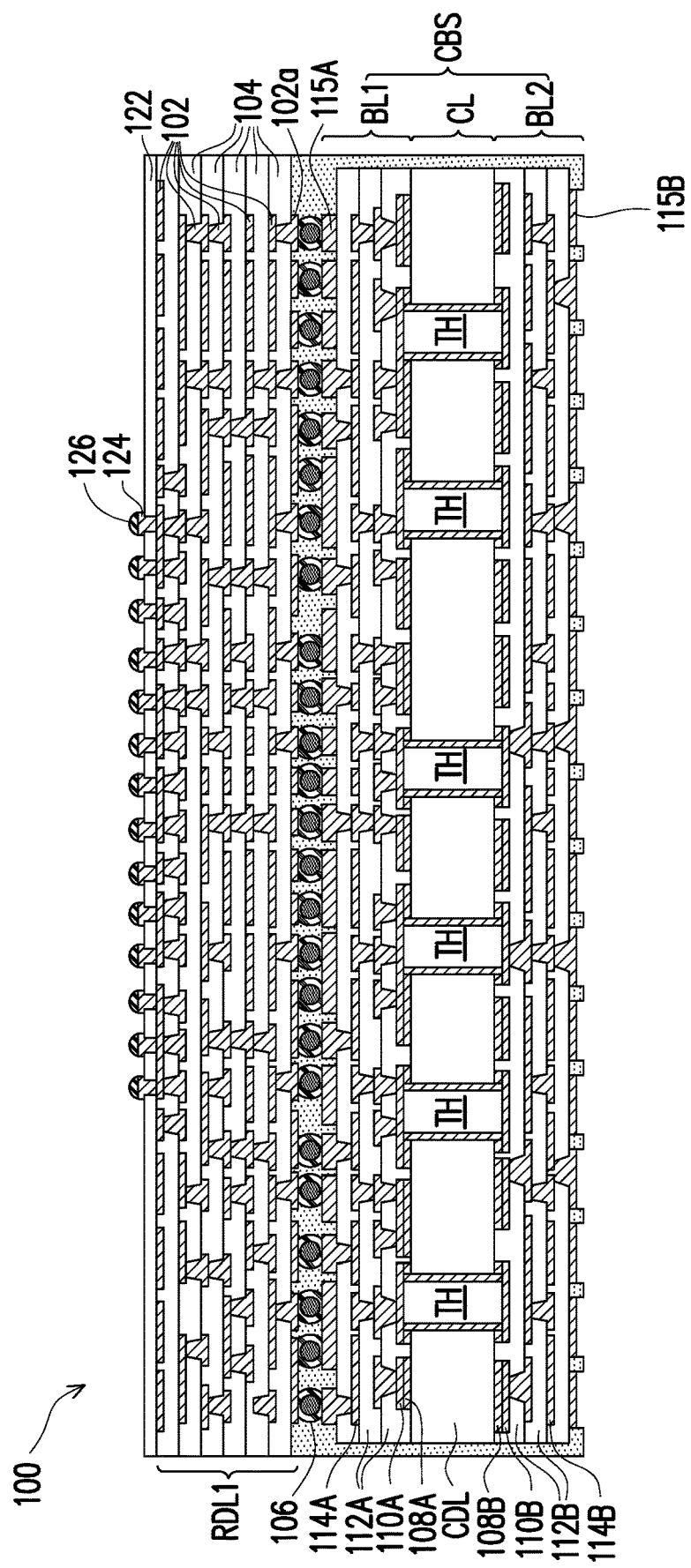

Referring to FIG. 1G, in some embodiments, a dicing process is performed to cut the whole structure (at least cutting though the redistribution layer structure RDL1 and the dielectric layer 122) along a cutting line into individual and separated integrated substrates 100 for semiconductor package, as shown in FIG. 1G.

In the present embodiment, the cutting line is apart from the sidewalls of the circuit board structure CBS, and the sidewalls of the circuit board structure CBS may be covered by the insulating material 116 after the dicing process. That is, the insulating material 116 surrounds the circuit board structure CBS after the dicing process. However, the disclosure is not limited thereto. In other embodiments, the cutting line is substantially an extension line of the sidewalls of the circuit board structure CBS, such that the sidewalls of the circuit board structure CBS may be exposed after the dicing process. In some embodiments, the dicing process is a wafer dicing process including mechanical blade sawing or laser cutting. In some embodiments, the integrated substrate 100 for package structure may include the circuit board structure CBS (i.e., a semi-finished circuit substrate), the redistribution layer structure (i.e., the redistribution layer structure RDL1, and the conductive pattern 124, and the dielectric layer 122), the bonding elements 106, and the bonding structures 126.

Figure 1H:
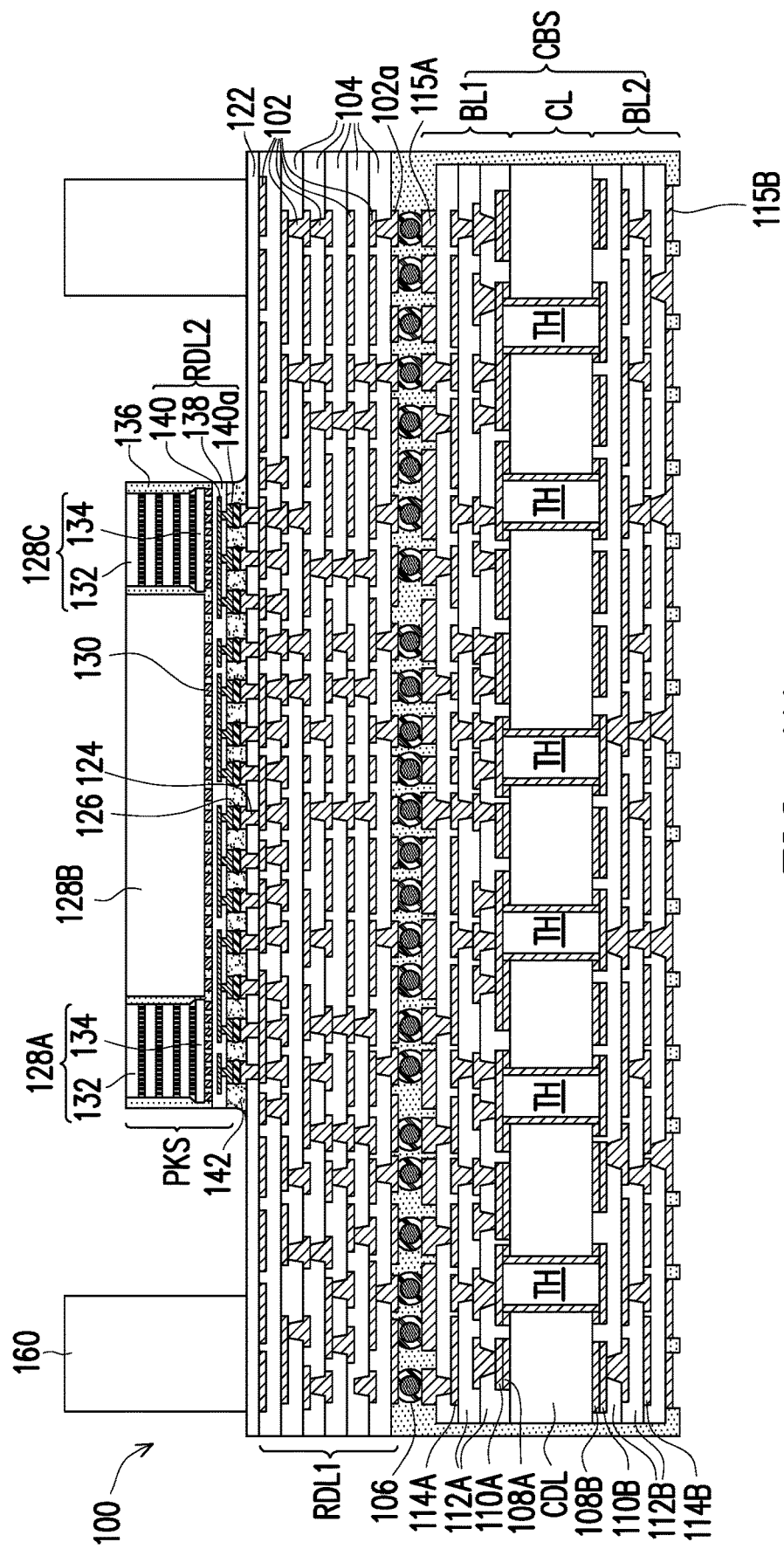

Referring to FIG. 1H, a semiconductor package PKS is bonded onto the integrated substrate 100 through the bonding structures 126. In other words, the bonding structures 126 are disposed between and electrically connected to the redistribution layer structure RDL1 and the semiconductor package PKS. In some embodiments, the package structure PKS may include System-On-Chip (SoC) packages, Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. In some embodiments, the semiconductor package PKS includes a plurality of package components 128A, 128B, 128C with a plurality of connectors 130 thereon, an encapsulant 136 encapsulating the package components 128A, 128B, 128C, and a redistribution layer structure RDL2 over the encapsulant 136.

In some embodiments, each of the package components 128A, 128B, 128C may be a package, a device die, a die stack, and/or the like. The device die may be high performance integrated circuit, such as a System-on-Chip (SoC) die, a Central Processing Unit (CPU) die, a Graphic Processing Unit (GPU) die, field-programmable gate array (FPGA) die, a mobile application die, a memory die, or a die stack. In some embodiments, the memory die may be in the form of memory cube such as High Bandwidth Memory (HBM) cube. The package components 128A, 128B, 128C may have the respective semiconductor substrates (not shown) in the respective dies. In some embodiments, a rear surface of the semiconductor substrates is a surface that faces upward in accordance to the orientation illustrated in FIG. 1H. The package components 128A, 128B, 128C further include integrated circuit devices (such as active devices, which include transistors, for example, not shown) at a front surface (e.g., a surface facing downward) of the respective semiconductor substrates. In some embodiments, the package components 128A, 128B, 128C may have the same or different sizes and/or functions upon the design requirements. In one of the exemplary embodiments, the package components 128A, 128C may be memory cubes, and the package component 128B may be CPU, GPU, FPGA or other suitable high performance integrated circuit. In the exemplary embodiment, the package component 128A, 128C may include a die stack 132, and a controller 134 at the bottom of the die stack 132.

Figure 1I:
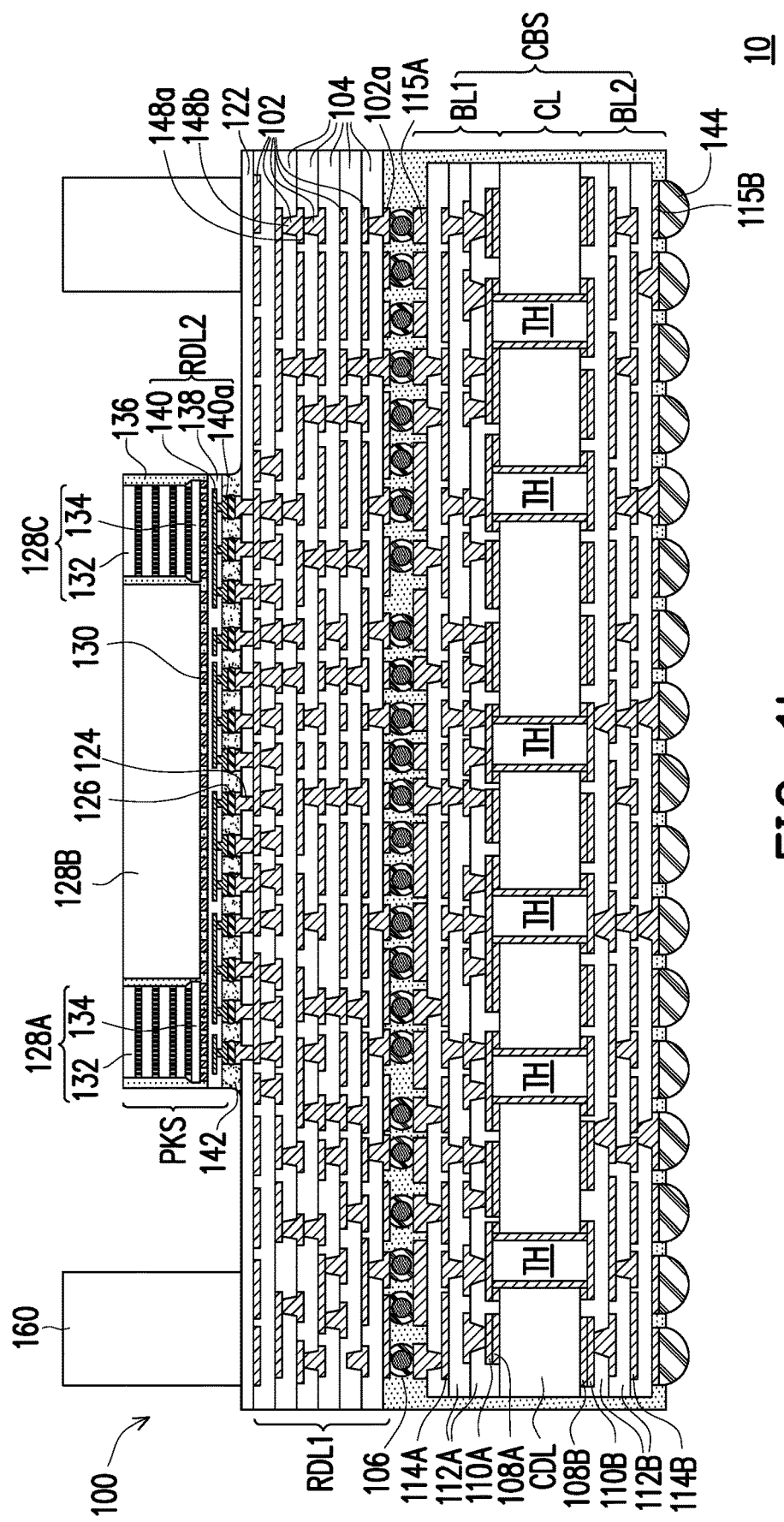

In some embodiments, the connectors 130 of package components 128A, 128B, 128C may be encapsulated in the encapsulant 136 as shown in FIG. 1I. Alternately, the connectors 130 may be disposed in a dielectric layer (not shown) which is then encapsulated by the encapsulant 136. In some embodiments, the redistribution layer structure RDL2 is disposed over the package components 128A, 128B, 128C and the encapsulant 136 and electrically connected to the package components 128A, 128B, 128C. In some embodiments, the redistribution layer structure RDL2 may be a fan-out redistribution layer structure, for example. The redistribution layer structure RDL2 may include a plurality of dielectric layers 138 and a plurality of conductive patterns 140, 140a. The dielectric layers 138 and the conductive patterns 140, 140a are alternately stacked over the package components 128A, 128B, 128C. In some embodiments, the outermost conductive pattern 140a is used as conductive terminals, which may include a plurality of conductive pillars and a plurality of under-ball metallurgy (UBM) patterns therebeneath for ball mount. In some embodiments, after bonding, an underfill 142 may be dispensed to protect the bonding structure between the package structure PKS and the redistribution layer structure over the circuit board structure CBS. In some embodiments, a total thickness ranging from a bottom of the underfill 142 to a top of the package structure PKS may be in a range of 50 μm to 1500 μm. In some embodiments, the package structure PKS is pre-fabricated, that is, the package components 128A, 128B, 128C are encapsulated by the encapsulant 136 before bonding to the integrated substrate 100. However, the disclosure is not limited thereto. In some alternative embodiments, the package components 128A, 128B, 128C may be bonded to the integrated substrate 100, and then the encapsulant 136 is formed over the integrated substrate 100 to encapsulate the package components 128A, 128B, 128C, for example.

An adhesive 160 may be applied to any desired areas of the integrated substrate 100 and may be formed in a pattern (e.g., an adhesive ring) as a perimeter around the semiconductor package PKS. In some embodiments, the adhesive 160 is ring-shaped and surrounding the semiconductor package PKS. In other embodiments, the adhesive 160 is ring-shaped with at least one of opening. In some embodiments, a height of the adhesive 160 is greater than that of the package structure PKS. However, the disclosure is not limited thereto. In some alternative embodiments, a height of the adhesive 160 is smaller than that of the package structure PKS. The adhesive 160 may be used to adhere heatsink onto the integrated substrate 100, where the heatsink may contact the package structure PKS so as to improve the heat dissipation of the package structure PKS.

Referring to FIG. 1I, after the package structure PKS is formed, a plurality of conductive terminals 144 are formed in the openings 120 exposing the outermost conductive pattern 115B of the second build-up layer BL2. That is, the conductive terminals 144 are disposed on a surface of the circuit board structure CBS opposite to a surface on which the redistribution layer structure RDL1 is disposed. The conductive terminals 144 are electrically connected to the outermost conductive patterns 115B in the second build-up layer BL2 of the circuit board structure CBS.

In some embodiments, the conductive terminals 144 may be ball grid array (BGA) connectors, solder balls, metal pillars, and/or the like. In some embodiments, a diameter of the conductive terminals 144 is, for example, in a range of about 400 μm to about 1000 μm, and the diameter of the conductive terminals 144 is larger than the diameter of the bonding elements 106. In some embodiments, a pitch of the conductive terminals 144 may be in a range from 600 μm to 1500 μm, and the pitch of the bonding materials 106 is smaller than the pitch of the conductive terminals 144. In some embodiments, the conductive terminals 144 may be formed by a mounting process and a reflow process. In some embodiments, the openings 120 are filled with the conductive terminals 144. Alternatively, the conductive terminals 144 does not fully cover the outermost conductive patterns 115B, and a gap may be formed between the conductive terminal 144 and the insulating pattern 118. In certain embodiments, the conductive terminals 144 are available to be mounted onto additional electrical components (e.g., circuit carrier, system board, mother board, etc.).

At this point, a semiconductor package 10 is fabricated. In some embodiments, the semiconductor package 10 may have a super large size equal to 50 mm×50 mm or 100 mm×100 mm or larger.

Figure 2A:
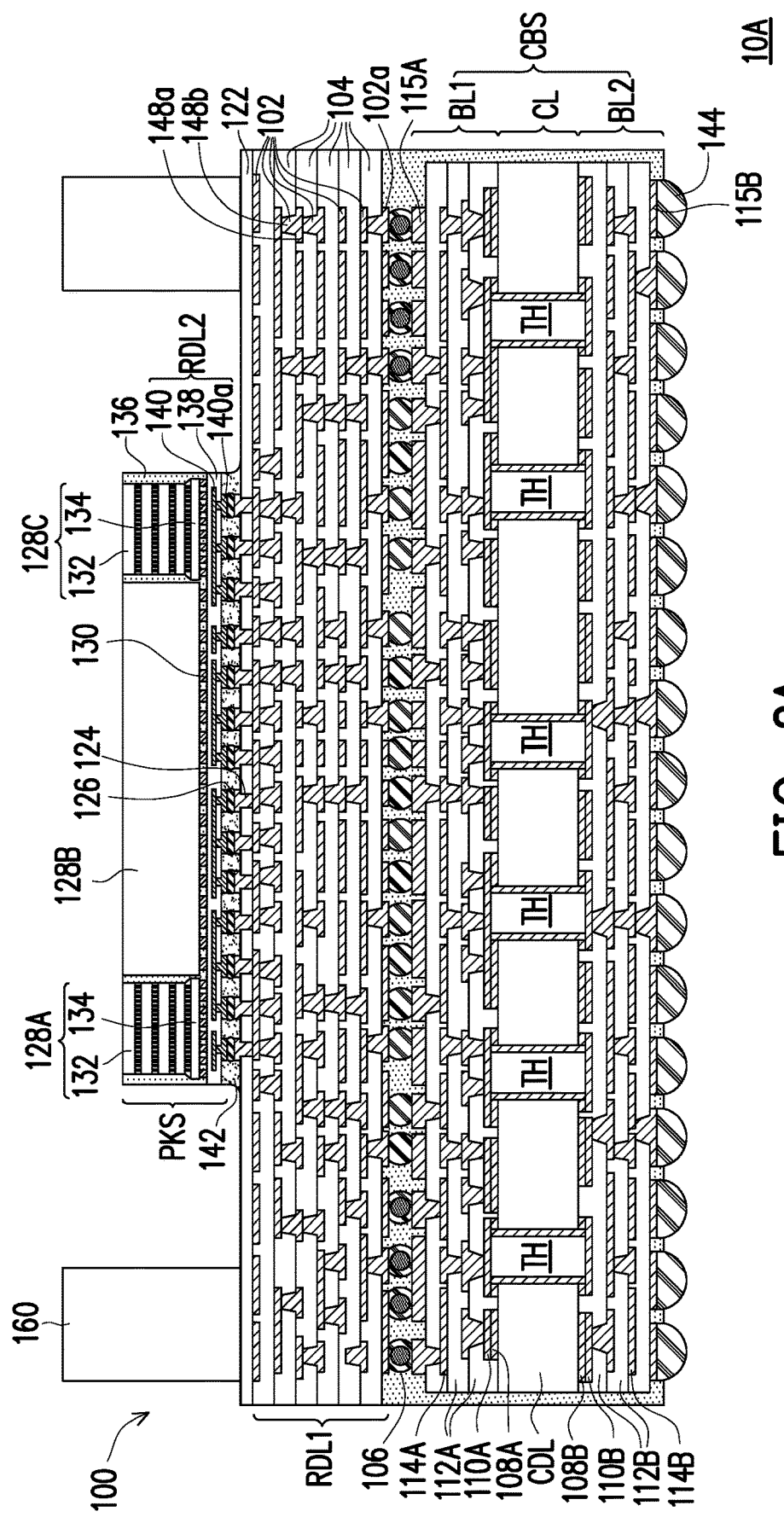
FIG. 2A schematically illustrate a cross-sectional view for a package structure in accordance with some embodiments of the disclosure.
Figure 2B:
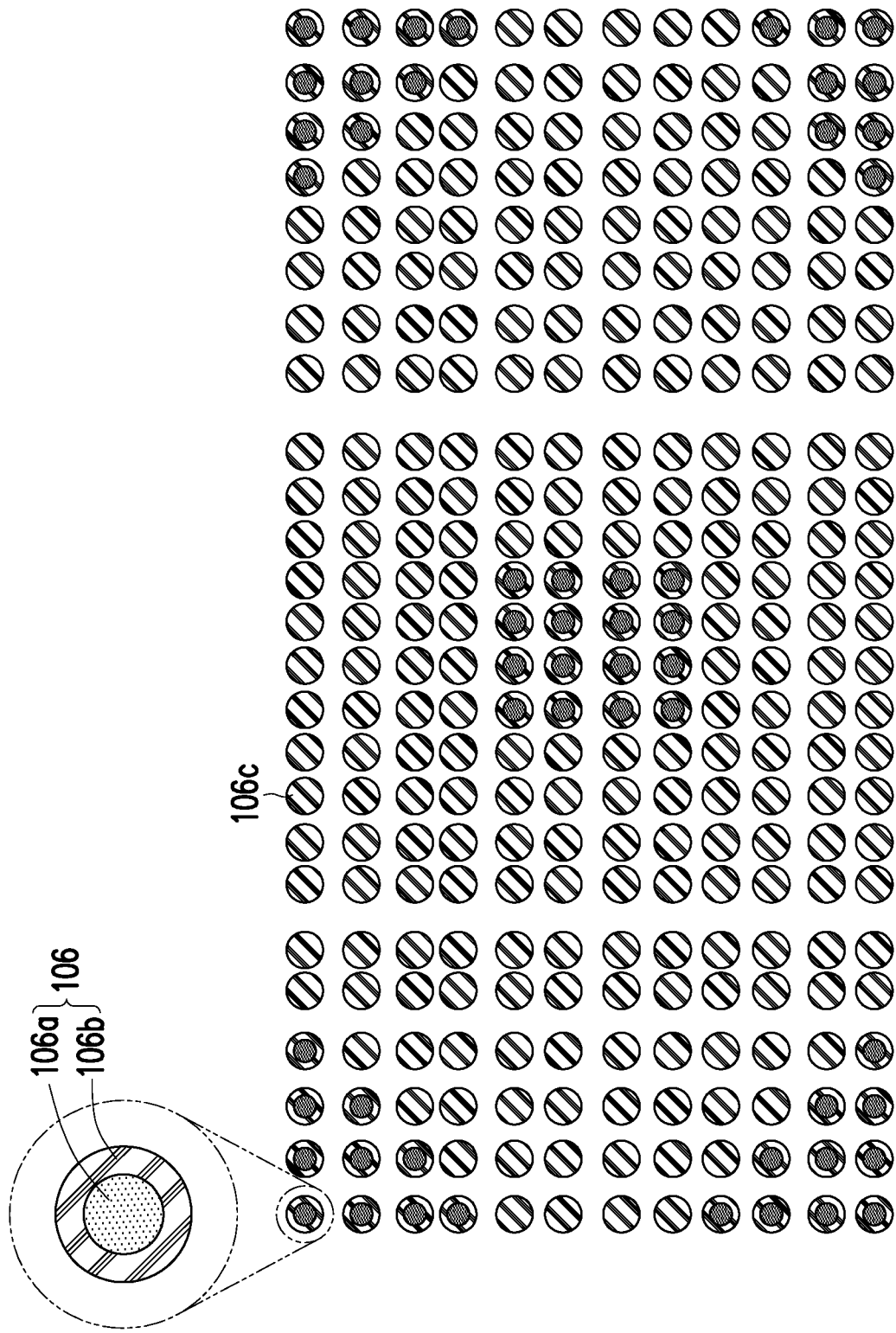
FIG. 2B schematically illustrate a top view of conductive materials and bonding elements in accordance with FIG. 2A.

FIG. 2A schematically illustrate a cross-sectional view for a package structure in accordance with some embodiments of the disclosure. FIG. 2B schematically illustrate a top view of conductive materials and bonding elements in accordance with FIG. 2A.

The semiconductor package 10A illustrated in FIG. 2A is similar to the semiconductor package 10 illustrated in FIG. 1I, hence the same reference numerals are used to refer to the same and liked parts, and its detailed description will be omitted herein. The difference between the semiconductor package 10 and the semiconductor package 10A is in the configuration of the conductive materials 106c and the bonding element 106.

Referring to FIGS. 2A and 2B, before bonding the circuit board structure CBS onto the redistribution layer structure RDL1, the conductive materials 106c and the bonding element 106 are formed on the redistribution layer structure RDL1 or the circuit board structure CBS. In some embodiments, a material of the conductive materials 106c includes conductive material, such as solder material (e.g. tin, tin/silver/copper (SAC) solder, or other suitable material). In some embodiments, the material of the conductive materials 106c is the same as that of the shell portion 106b. That is, a stiffness of the core portion 106a is higher than a stiffness of the shell portion 106b and the conductive materials 106c.

After forming the conductive materials 106c and the bonding element 106, the circuit board structure CBS is bonded onto the redistribution layer structure RDL1 through the bonding elements 106 and the conductive materials 106c. In some embodiments, a reflow process is performed on the bonding elements 106 and the conductive materials 106c so as to shape the bonding elements 106 and the conductive materials 106c into the desired shapes. In some embodiments, the height of the bonding elements 106 is the same as the height of the conductive materials 106c after the reflow process.

In some embodiments, a diameter of the bonding elements 106 is the same as a diameter of the conductive materials 106c. However, the disclosure is not limited thereto. In other embodiment, a diameter of the bonding elements 106 is different to a diameter of the conductive materials 106.

In some embodiments, the conductive materials 106c and the bonding elements 106 are arrange in an array, where the bonding elements 106 are arrange in corners and center of the array so as to provide strong support between the circuit board structure CBS and the redistribution layer structure RDL1. However, the disclosure is not limited thereto. The arrangement of the conductive materials 106c and the bonding elements can be adjusted according to the actual requirement. In some embodiments, since the material of the conductive materials 106c is solder, the connection between the circuit board structure CBS and the redistribution layer structure RDL1 can be improved.

Figure 3A:
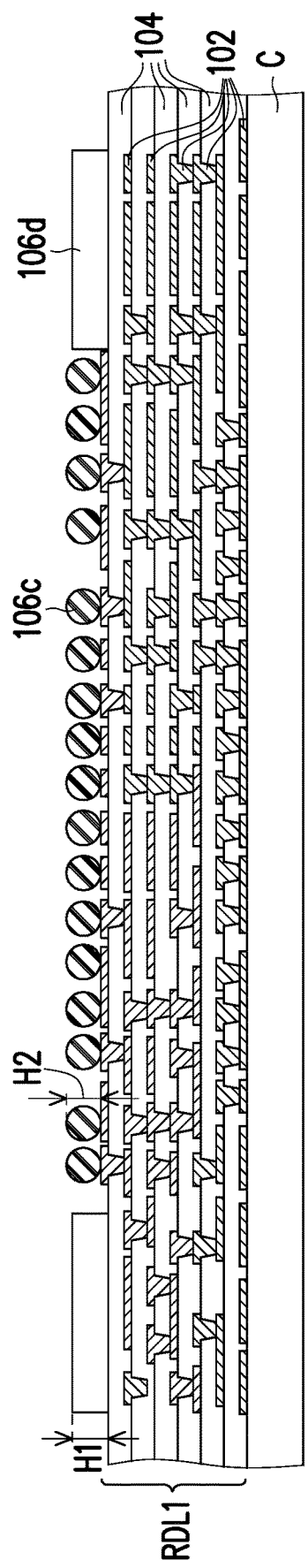
FIGS. 3A through 3B schematically illustrate cross-sectional views for manufacturing a package structure in accordance with some embodiments of the disclosure.
Figure 3B:
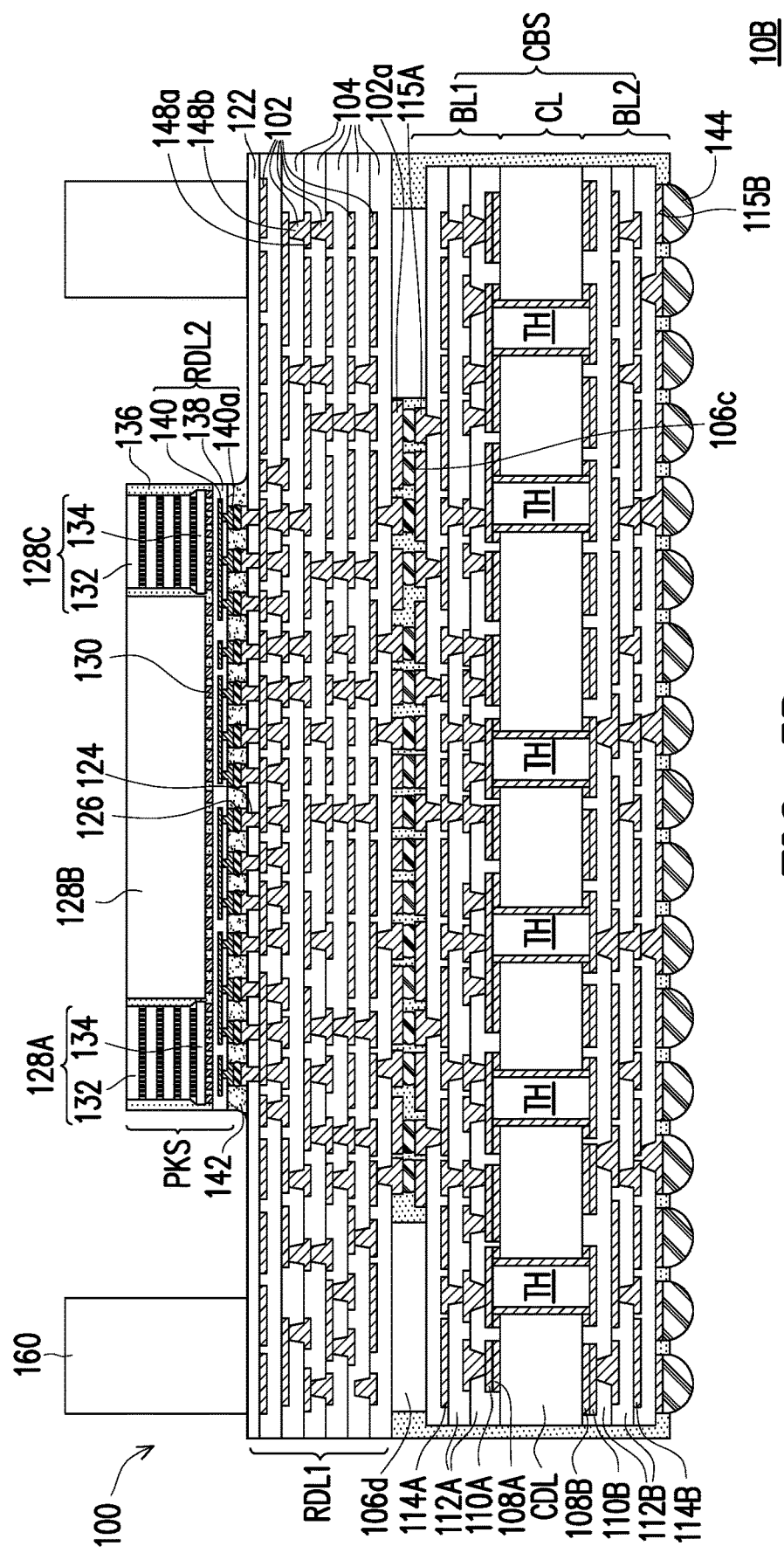
Figure 4:
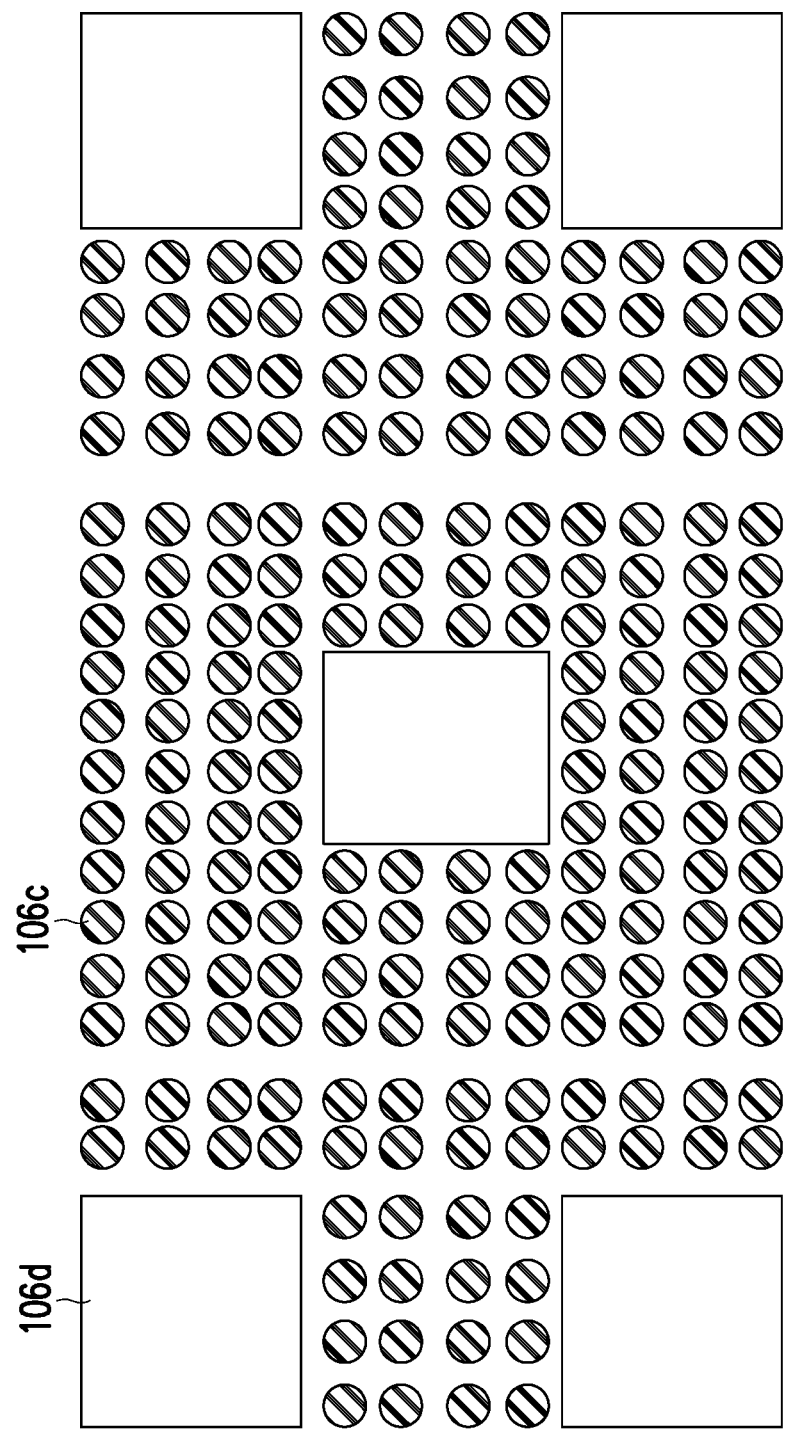
FIG. 4 schematically illustrate a top view of conductive materials and bonding elements in accordance with FIG. 3B.

FIGS. 3A through 3B schematically illustrate cross-sectional views for manufacturing a package structure in accordance with some embodiments of the disclosure. FIG. 4 schematically illustrate a top view of conductive materials and bonding elements in accordance with FIG. 3B.

The semiconductor package 10B illustrated in FIG. 3B is similar to the semiconductor package 10A illustrated in FIG. 2A, hence the same reference numerals are used to refer to the same and liked parts, and its detailed description will be omitted herein. The difference between the semiconductor package 10A and the semiconductor package 10B is in the configuration of the conductive materials 106c and the connection structures 106d.

Referring to FIG. 3A, before bonding the circuit board structure CBS to the redistribution layer structure RDL1, the conductive materials 106c and the connection structures 106d are formed on the redistribution layer structure RDL1 or the circuit board structure CBS. In some embodiments, the connection structures 106d may be nonconductive film or nonconductive past, and a material of the connection structures 106d includes insulating material, such as plastic (e.g. bismaleimide-triazine (BT), polypropylene (PP), die attach film (DAF), or other suitable material). In some embodiments, a stiffness of the connection structures 106d is higher than a stiffness of the conductive materials 106c.

Referring to FIGS. 3B and 4, after forming the conductive materials 106c and the connection structures 106d on the redistribution layer structure RDL1 or the circuit board structure CBS, the first circuit board structure CBS is bonded onto the redistribution layer structure RDL1 through the plurality of conductive materials 106c. In some embodiments, a reflow process is performed on the conductive materials 106c so as to attach the circuit board structure CBS onto the redistribution layer structure RDL1 through the conductive materials 106c and shape the conductive materials 106c into the desired shapes. In some embodiments, the conductive materials 106c may deform after the reflow process without a deformation of the connection structures 106d.

In some embodiments, the conductive materials 106c may be ball-shaped before the reflow process. In some embodiments, the conductive materials 106c may be pillar-shaped after the reflow process. However, the disclosure is not limited thereto. In some embodiments, a shape of the connection structure 106d may be a rectangular, a round, an ellipse, a triangle or other shape. The shape of the connection structure 106d may be adjusted according to the actual requirement. The temperature of the reflow process performed on the conductive materials 106c is in a range of about 120 degrees centigrade to about 300 degrees centigrade.

In other embodiments, the height H1 of the connection structures 106d is less than or equal to the height of the conductive materials 106c before the reflow process. That is, the conductive materials 106c are in contact with the circuit board structure CBS and the connection structures 106d are separated from the circuit board structure CBS before the reflow process. After the reflow process, the height H2 of the conductive materials 106c is reduced due to the deformation and the circuit board structure CBS is in contact with the connection structures 106d. In other embodiment, since the conductive pattern 102a is protrude from the surface of the redistribution layer structure RDL1 and the outmost conductive pattern 115A is protrude from the surface of the circuit board structure CBS, although the height H1 of the connection structures 106d is larger than the height H2 of the conductive materials 106c, the conductive materials 106c are in contact with the outmost conductive pattern 115A of the circuit board structure CBS before the reflow process.

In some embodiments, the conductive materials 106c and the connection structures 106d are arrange in an array, wherein the connection structures 106d are arrange in corners and center of the array so as to provide strong support between the circuit board structure CBS and the redistribution layer structure RDL1. However, the disclosure is not limited thereto. The arrangement of the conductive materials 106c and the connection structures 106d can be adjusted according to the actual requirement.

Figure 5:
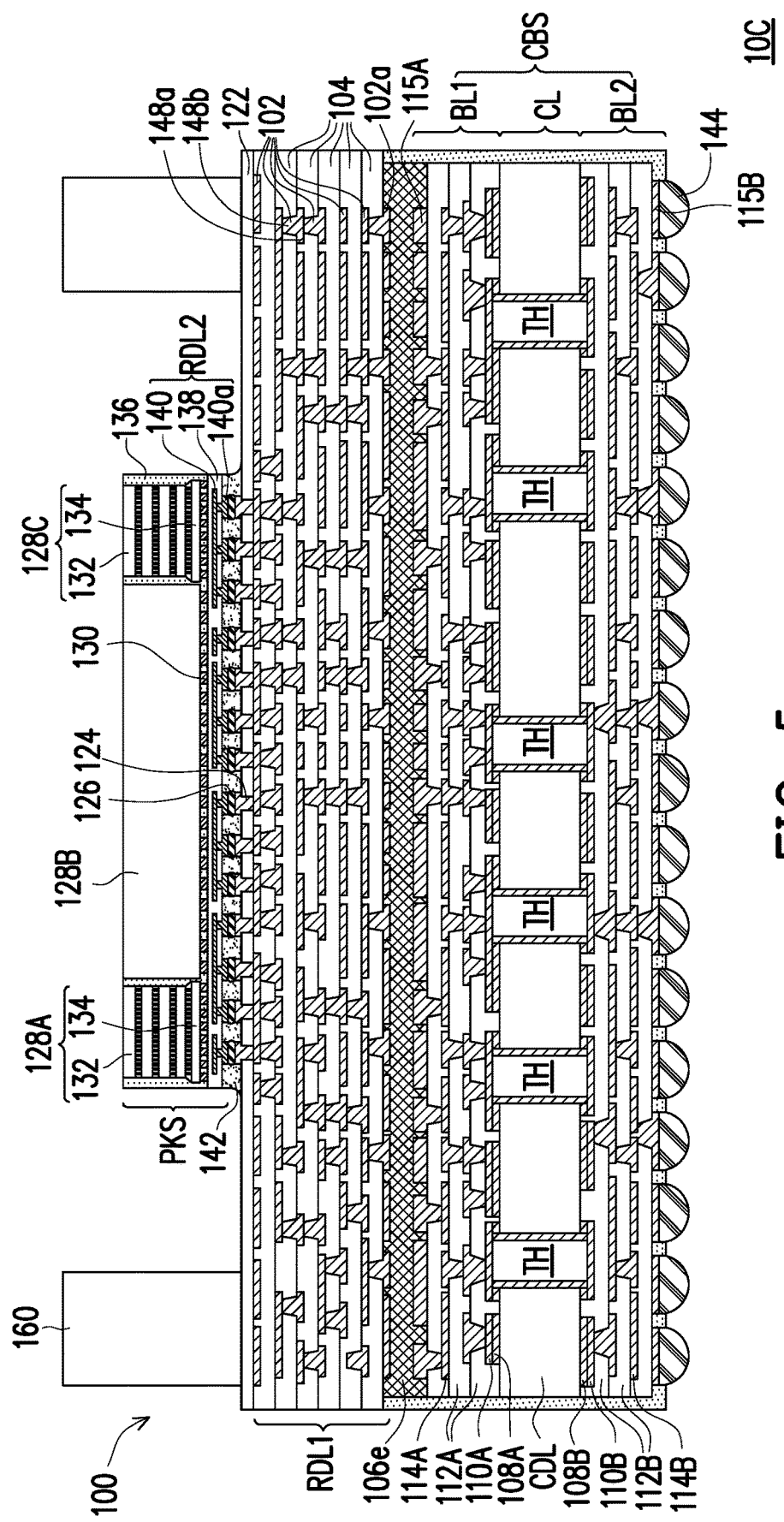
FIG. 5 schematically illustrate a cross-sectional view of a package structure in accordance with some embodiments of the disclosure.

FIG. 5 schematically illustrate a cross-sectional view of a package structure in accordance with some embodiments of the disclosure.

The semiconductor package 10C illustrated in FIG. 5 is similar to the semiconductor package 10B illustrated in FIG. 3B, hence the same reference numerals are used to refer to the same and liked parts, and its detailed description will be omitted herein. The difference between the semiconductor package 10B and the semiconductor package 10C is in the configuration of the connection structures 106e.

Referring to FIG. 5, the circuit board structure CBS is bonded onto the redistribution layer structure RDL1. A connection structure 106e is disposed between the redistribution layer structure RDL1 and the circuit board structure CBS. In some embodiments, the connection structure 106e is formed on the conductive pattern 102a of the redistribution layer structure RDL1, then the circuit board structure CBS is bonded onto the redistribution layer structure RDL1 through the connection structure 106e. However, the disclosure is not limited thereto. In other embodiments, the connection structure 106e is formed on the outmost conductive pattern 115A of the circuit board structure CBS, then the circuit board structure CBS is bonded onto the redistribution layer structure RDL1 through the connection structure 106e. The connection structure 106e is directly in contact with the redistribution layer structure RDL1 and the circuit board structure CBS.

In some embodiments, the connection structure 106e is an anisotropic conductive film (ACF) including a resin and conductive particles dispersed in the resin.

An insulating material 116 is formed to encapsulate the circuit board structure CBS. The insulating material 116 surrounds sidewalls of the circuit board structure CBS and sidewalls of the connection structure 106e.

In some embodiments, a dicing process is performed to cut the whole structure along a cutting line into individual and separated integrated substrates 100 for semiconductor package. In the present embodiment, the cutting line is apart from the sidewalls of the circuit board structure CBS, and the sidewalls of the circuit board structure CBS and the sidewalls of the connection structure 106e may be covered by the insulating material 116 after the dicing process. That is, the insulating material 116 surrounds the circuit board structure CBS after the dicing process. However, the disclosure is not limited thereto. In other embodiments, the cutting line is substantially an extension line of the sidewalls of the circuit board structure CBS, such that the sidewalls of the circuit board structure CBS and the sidewalls of the connection structure 106e may be exposed after the dicing process. In some embodiments, the dicing process is a wafer dicing process including mechanical blade sawing or laser cutting.

Figure 6:
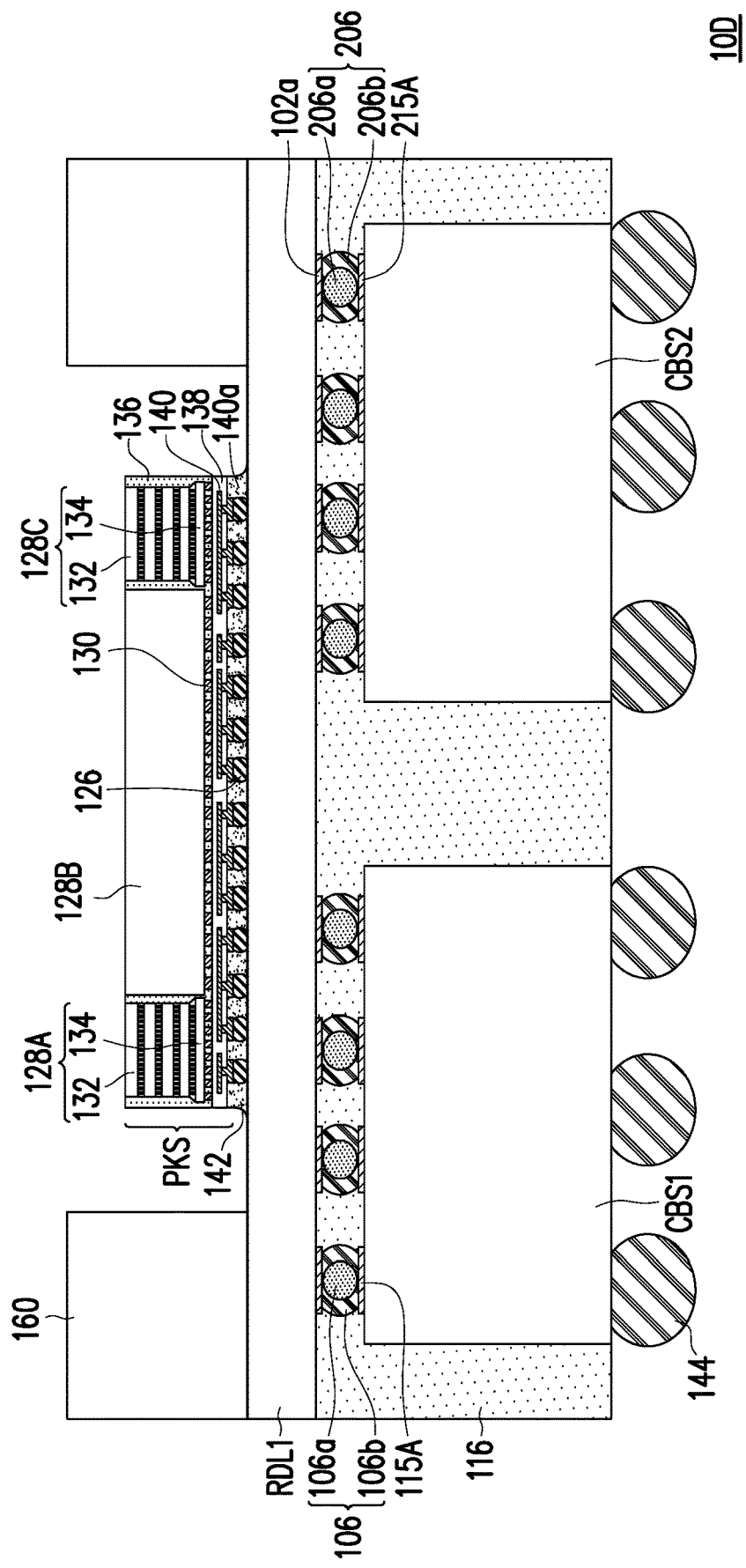
FIG. 6 schematically illustrate a cross-sectional view of a package structure in accordance with some embodiments of the disclosure.

FIG. 6 schematically illustrate a cross-sectional view of a package structure in accordance with some embodiments of the disclosure.

The semiconductor package 10D illustrated in FIG. 6 is similar to the semiconductor package 10 illustrated in FIG. 1I, hence the same reference numerals are used to refer to the same and liked parts, and its detailed description will be omitted herein. The difference between the semiconductor package 10D and the semiconductor package 10 is in that the semiconductor package 10D includes two circuit board structures.

For the convenience of illustration, some components in a second circuit board structure CBS2, a first circuit board structure CBS1, and the redistribution layer structure RDL1 are not shown.

Referring to FIG. 6, the first circuit board structure CBS1 and the second circuit board structure CBS2 are electrically connected to the redistribution layer structure RDL1 through the first bonding elements 106 and the second bonding elements 206, respectively. The first bonding elements 106 are disposed between and electrically connected to the conductive pattern 102a of the redistribution layer structure RDL1 and the conductive pattern 115A of the first circuit board structure CBS1. The second bonding elements 206 are disposed between and electrically connected to the conductive pattern 102a of the redistribution layer structure RDL1 and the conductive pattern 215A of the second circuit board structure CBS2.

An insulating material 116 is formed to encapsulate the first circuit board structure CBS1 and the second circuit board structure CBS2 over the redistribution layer structure RDL1. The insulating material 116 surrounds sidewalls of the first circuit board structure CBS1 and sidewalls of the second circuit board structure CBS2.

Each of the first bonding elements 106 has a core portion 106a and a shell portion 106b surrounding the core portion 106a, and a stiffness of the core portion 106a is higher than a stiffness of the shell portion 106b. Each of the second bonding elements 206 has a core portion 206a and a shell portion 206b surrounding the core portion 206a, and a stiffness of the core portion 206a is higher than a stiffness of the shell portion 206b.

In some embodiments, since the bonding elements include the core portion and the shell portion, the bonding elements are not easily deformed by pressure when grinding the insulating material 116. Therefore, the coplanarity of the first circuit board structure CBS1 and the second circuit board structure CBS2 can be improved and the yield of forming the conductive terminals 144 on the first circuit board structure CBS1 and the second circuit board structure CBS2 can be improved.

Figure 7:
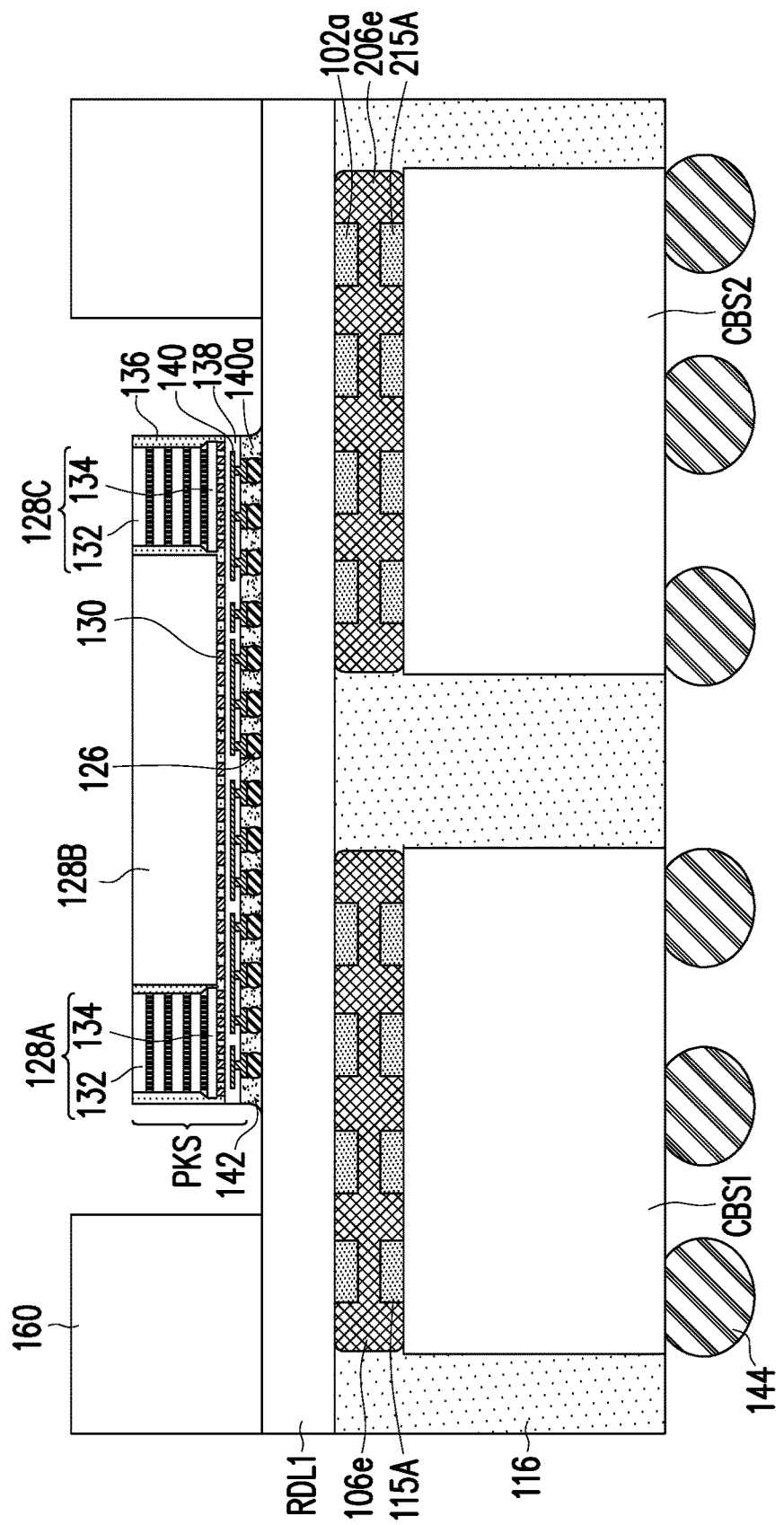
FIG. 7 schematically illustrate a cross-sectional view of a package structure in accordance with some embodiments of the disclosure.

FIG. 7 schematically illustrate a cross-sectional view of a package structure in accordance with some embodiments of the disclosure.

The semiconductor package 10E illustrated in FIG. 7 is similar to the semiconductor package 10C illustrated in FIG. 5, hence the same reference numerals are used to refer to the same and liked parts, and its detailed description will be omitted herein. The difference between the semiconductor package 10E and the semiconductor package 10C is in that the semiconductor package 10E includes two circuit board structures.

For the convenience of illustration, some components in a second circuit board structure CBS2, a first circuit board structure CBS1, and the redistribution layer structure RDL1 are not shown.

Referring to FIG. 7, the first circuit board structure CBS1 and the second circuit board structure CBS2 are electrically connected to the redistribution layer structure RDL1 through the first connection structure 106e and the second connection structure 206e, respectively. The first connection structure 106e are disposed between and electrically connected to the conductive pattern 102a of the redistribution layer structure RDL1 and the conductive pattern 115A of the first circuit board structure CBS1. The second connection structure 206e are disposed between and electrically connected to the conductive pattern 102a of the redistribution layer structure RDL1 and the conductive pattern 215A of the second circuit board structure CBS2. In some embodiments, the first connection structure 106e and the second connection structure 206e are anisotropic conductive films.

An insulating material 116 is formed to encapsulate the first circuit board structure CBS1 and the second circuit board structure CBS2. The insulating material 116 surrounds sidewalls of the first circuit board structure CBS1, sidewalls of the second circuit board structure CBS2, sidewalls of the first connection structure 106e, and sidewalls of the second connection structure 206e.

Compare to the conventional solder ball, the first connection structure 106e and the second connection structure 206e used in the embodiment may connect the redistribution layer structure RDL1 to the first circuit board structure CBS1 and the second circuit board structure CBS2 without serious deformation. Therefore, the coplanarity of the first circuit board structure CBS1 and the second circuit board structure CBS2 can be improved and the yield of forming the conductive terminals 144 on the first circuit board structure CBS1 and the second circuit board structure CBS2 can be improved.

In accordance with some embodiments of the present disclosure, a package structure includes a first circuit board structure, a redistribution layer structure, bonding elements, and a semiconductor package. The redistribution layer structure is disposed over and electrically connected to the first circuit board structure. The bonding elements are disposed between and electrically connected to the redistribution layer structure and the first circuit board structure. Each of the bonding elements has a core portion and a shell portion surrounding the core portion. A stiffness of the core portion is higher than a stiffness of the shell portion. A semiconductor package is disposed over and electrically connected to the redistribution layer structure.

In accordance with alternative embodiments of the present disclosure, a method of fabricating a package structure includes following steps. A redistribution layer structure is formed. A circuit board structure is bonded onto the redistribution layer structure through bonding elements, wherein each of the bonding elements has a core portion and a shell portion surrounding the core portion. A stiffness of the core portion is higher than a stiffness of the shell portion. An insulating material is formed to encapsulate the circuit board structure. A semiconductor package is bonded onto the redistribution layer structure.

In accordance with yet alternative embodiments of the present disclosure, a method of fabricating a package structure includes following steps. A redistribution layer structure is formed. A circuit board structure is bonded onto the redistribution layer structure, wherein a connection structure is disposed between the redistribution layer structure and the circuit board structure. An insulating material is formed to encapsulate the circuit board structure, wherein the insulating material surrounds sidewalls of the circuit board structure. A semiconductor package is bonded onto the redistribution layer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package structure, comprising:
    forming a redistribution layer structure;
    bonding a first circuit board structure onto the redistribution layer structure through a plurality of first bonding elements, wherein each of the plurality of first bonding elements has a core portion and a shell portion surrounding the core portion, and a stiffness of the core portion is higher than a stiffness of the shell portion;
    forming an insulating material to encapsulate the first circuit board structure; and
    bonding a semiconductor package onto the redistribution layer structure.

2. The method according to claim 1, further comprises:
    bonding the first circuit board structure onto the redistribution layer structure through the plurality of first bonding elements and a plurality of conductive materials, wherein the stiffness of the core portion is higher than a stiffness of the plurality of conductive materials.

3. The method according to claim 1, further comprises:
    forming the redistribution layer structure on a carrier; and
    removing the carrier after bonding the first circuit board structure onto the redistribution layer structure through the plurality of first bonding elements.

4. The method according to claim 1, further comprises:
    bonding a second circuit board structure onto the redistribution layer structure through a plurality of second bonding elements.

5. The method according to claim 1, wherein a side of the first circuit board structure opposite to the redistribution layer structure is exposed by the insulating material.

6. The method according to claim 5, further comprises:
    forming a plurality of conductive terminals on the side of the first circuit board structure opposite to the redistribution layer structure, wherein a diameter of each of the conductive terminals is larger than a diameter of each of the first bonding elements.

7. A method of fabricating a package structure, comprising:
    forming a redistribution layer structure;
    bonding a circuit board structure onto the redistribution layer structure, wherein a connection structure is disposed between the redistribution layer structure and the circuit board structure;
    forming an insulating material to encapsulate the circuit board structure, wherein the insulating material surrounds sidewalls of the circuit board structure; and
    bonding a semiconductor package onto the redistribution layer structure.

8. The method according to claim 7, wherein the connection structure is an anisotropic conductive film, and the connection structure is directly in contact with the redistribution layer structure and the circuit board structure.

9. The method according to claim 8, wherein the insulating material surrounds sidewalls of the connection structure.

10. The method according to claim 7, further comprises:
    bonding the circuit board structure onto the redistribution layer structure through a plurality of conductive materials, wherein a stiffness of the connection structure is higher than a stiffness of the plurality of conductive materials; and
    performing a reflow process on the plurality of conductive materials.

11. The method according to claim 10, wherein the connection structure is an insulation layer.

12. The method according to claim 10, wherein a height of the connection structure is less than a height of the plurality of conductive materials before the reflow process.

13. The method according to claim 12, wherein the connection structure is separated from the circuit board structure before the reflow process and in contact with the circuit board structure after the reflow process.

14. The method according to claim 2, wherein a material of the plurality of conductive materials is the same as that of the shell portion of the plurality of first bonding elements.

15. The method according to claim 2, further comprises:
    performing a reflow process on the plurality of first bonding elements and the plurality of conductive materials so as to shape the plurality of first bonding elements and the plurality of conductive materials.

16. The method according to claim 2, wherein a diameter of each of the plurality of first bonding elements is the same as a diameter of each of the plurality of conductive materials.

17. The method according to claim 2, wherein the plurality of conductive materials and the plurality of first bonding elements are arranged in an array, wherein the plurality of first bonding elements are arranged in corners and center of the array.

18. The method according to claim 1, wherein the insulating material is formed between the plurality of first bonding elements.

19. The method according to claim 12, wherein after the reflow process, the height of the plurality of conductive materials is reduced and then the circuit board structure is in contact with the connection structure.

20. The method according to claim 7, further comprises:
    bonding another circuit board structure onto the redistribution layer structure, wherein another connection structure is disposed between the redistribution layer structure and the another circuit board structure; and forming the insulating material to encapsulate the circuit board structure and the another circuit board structure, wherein the insulating material surrounds sidewalls of the circuit board structure and sidewalls of the another circuit board structure.

* * * * *